United States Patent [19]

Hayashi

[11] Patent Number: 5,510,292
[45] Date of Patent: Apr. 23, 1996

[54] MANUFACTURING METHOD FOR A SEMICONDUCTOR DEVICE HAVING LOCAL INTERCONNECTIONS

[75] Inventor: Hiromi Hayashi, Kawasaki, Japan

[73] Assignee: Fujitsu Limited, Kawasaki, Japan

[21] Appl. No.: 363,931

[22] Filed: Dec. 27, 1994

[30] Foreign Application Priority Data

Mar. 4, 1994 [JP] Japan .................. 6-035101

[51] Int. Cl.⁶ .................. H01L 21/44
[52] U.S. Cl. .................. 437/187; 437/192; 437/200; 437/245
[58] Field of Search .................. 437/187, 192, 437/200, 245; 216/75; 257/761, 770

[56] References Cited

U.S. PATENT DOCUMENTS

| | | | |
|---|---|---|---|
| 4,746,219 | 5/1988 | Holloway et al. | |
| 4,847,111 | 7/1989 | Chow et al. | 437/200 |
| 5,162,262 | 11/1992 | Ajika et al. | 437/200 |
| 5,190,893 | 3/1993 | Jones, Jr. et al. | 437/200 |
| 5,419,805 | 5/1995 | Jolly | 437/200 |

FOREIGN PATENT DOCUMENTS

| | | |
|---|---|---|
| 01175257 | 7/1989 | Japan . |
| 02002618 | 1/1990 | Japan . |
| 02302034 | 12/1990 | Japan . |

*Primary Examiner*—George Fourson
*Assistant Examiner*—Thomas G. Bilodeau
*Attorney, Agent, or Firm*—Nikaido, Marmelstein, Murray & Oram

[57] ABSTRACT

A semiconductor device and a method for manufacturing a semiconductor device having local interconnections for making electrical connection among conductive regions. The semiconductor device and the method for manufacturing the same utilizes interconnections made of a material of which selectivity of etching is high with respect to a semiconductor layer. The local interconnection is formed by patterning a tungsten nitride film with an etchant gas including a gas comprising fluorine. In addition to the gas comprising fluorine, a gas comprising hydrogen is introduced, at the latest, when the tungsten nitride film becomes thinned.

6 Claims, 4 Drawing Sheets

MANUFACTURING METHOD FOR A SEMICONDUCTOR DEVICE HAVING LOCAL INTERCONNECTIONS

BACKGROUND OF THE INVENTION

1. Field of the Invention

The present invention relates to a semiconductor device and a method for manufacturing the same. In particular, it relates to a semiconductor device provided with a local interconnection for making electrical connection among conductive regions and a method of manufacturing the same.

2. Description of the Prior Art

In order to increase the packing density of semiconductor devices, the areas of the constituent components and the necessary interconnections for interconnection thereamong have to be reduced and compacted. A variety of approaches have been proposed to this end.

The multilayer interconnection employed in the field is manufactured by alternately forming interconnections and insulating films. Namely, after formation of a first interconnection, an insulating film is formed over the first interconnection followed by forming a second interconnection on the insulating film.

The upper second interconnection and the lower first interconnection are connected to each other via a contact hole opened through the interlayer insulating film. However, when forming contact holes, an adequate margin for aligning masks has to be provided and, it becomes difficult by the necessity for the margin to miniaturize semiconductor devices.

Recently, in such a situation, those skilled in the art have taken an increasing interest in the possibilities of local interconnection, by which a interconnection can be connected to a near impurity diffusion region by means of a conductive film without making use of an interlayer insulating film and contact holes opened therethrough.

The local interconnection is formed by forming and patterning a metallic film over an electrode formed on a semiconductor substrate and an impurity diffusion region formed within the semiconductor substrate.

Examples of this technique are described in U.S. Pat. No. 4,746,219. In these cases, an electrode and an impurity diffusion region are connected by local interconnection after forming a salicide film (self-aligned silicide film) on the electrode and the impurity diffusion region for the purpose of decreasing the contact resistance of the interconnection.

Next, the method for manufacturing the local interconnection will be briefly explained in accordance with the Patent.

In FIG. 1A, an impurity diffusion region 103 is formed within a semiconductor substrate 101 surrounded by a field oxide film 102. Also, a first interconnection 104 of polysilicon is formed on the field oxide film 102 and provided with a sidewall oxide film 105 on the flank of the first interconnection 104. The conductivity type of the impurity diffusion region 103 is p-type when the conductivity type of the semiconductor substrate 101 is n-type.

In this situation, after forming a titanium (Ti) film 106, the first interconnection 104 and the impurity diffusion region 103 are heated together with titanium film 106 to form a titanium silicide film 107 by a reaction between titanium and silicon of the upper surfaces of the first interconnection 104 and the impurity diffusion region 103 as illustrated in FIG. 1B.

The titanium film 106 is then removed by etching, leaving the titanium silicide film 107 on the first interconnection 104 and the impurity diffusion region 103.

Next, as illustrated in FIGS. 1C and 1D, a titanium nitride film 108 is formed over the entire surface of the structure followed by patterning the titanium nitride film 108 to form a local interconnection 109.

The etching of the titanium nitride film 108 is carried out with a mixed gas composed of $CF_4$ and $Cl_2$. In the case of the etching with the mixed etchant gas, the semiconductor substrate 101 comes to slightly appear through the very thin edge of the field oxide film 102 which is removed from the semiconductor substrate 101 during the over-etching of the titanium nitride film 108, even though the field oxide film 102 is etched only very slightly by the etchant gas. As a result, the semiconductor substrate 101 is etched along the periphery of the field oxide film 102 by the etchant gas for titanium nitride to form a groove 110.

In this condition, when another interconnection is formed at the level upper than the local interconnection 109 over the groove 110, it may be the case that leakage current is passed across the PN junction between the impurity diffusion region 103 and the semiconductor substrate 101.

Furthermore, grooves such as the groove 110 can be formed also at the periphery of the first interconnection 104. This is because the upper portion of the sidewall oxide film 105 is etched, and therefore polysilicon of the first interconnection 104 is etched.

The interconnection resistance is varied when the shape of the first interconnection 104 is deformed. Also, when the first interconnection 104 serves as the gate electrode of a MOS transistor, the threshold voltage may be varied beyond the tolerance thereof, resulting in a problem of unstable operation of the transistor.

These problems are the cases also when the titanium silicide film 107 is not formed.

BRIEF SUMMARY OF THE INVENTION

It is an object of the present invention to provide a semiconductor device and a method for manufacturing the same with interconnections made of a material of which selectivity of etching is high with respect to a semiconductor layer.

In accordance with the present invention, local interconnection is formed from a tungsten nitride film which is patterned by etching with a gas comprising fluorine to which a gas comprising hydrogen is added, at the latest, when the tungsten nitride film becomes thinned.

When the etching is carried out with the mixed etchant gas, since the atmosphere of the etching gases does not become rich in fluorine, the selectivity of etching of tungsten nitride films respective to semiconductors such as silicon semiconductors is improved so that semiconductors are hardly etched during the etching process. As a result, even if the thin peripheries of the field oxide film are etched to expose part of the underlying semiconductor region, no groove is formed in the semiconductor region by etching.

Substantial leakage current can therefore be prevented from passing through PN junctions formed within a semiconductor layer. Furthermore, even in the case that interconnections or gate electrodes are formed from semiconductor layers, the resistances thereof can be prevented from varying due to the change of the shapes. Also, the threshold of a transistor can be prevented from varying due to the change of the shape of the gate electrode thereof.

DETAILED DESCRIPTION OF THE PREFERRED EMBODIMENTS (First Embodiment)

The method of forming local interconnection in accordance with an embodiment of the present invention is typically applicable, for example, to the method of manufacturing SRAM cells. In advance of detailedly describing an actual embodiment of the present invention, explanation is given for an SRAM cell with reference to an equivalent circuit and a plan view.

Figure 1A:
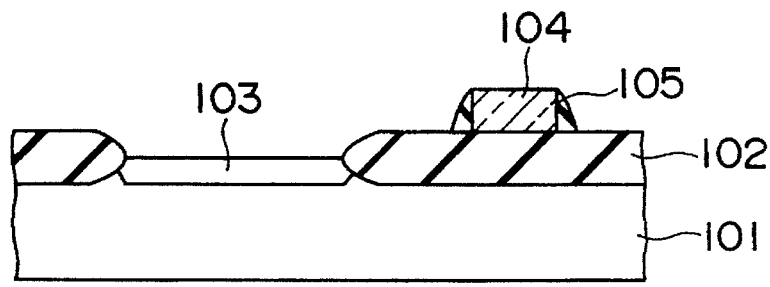
FIGS. 1A to 1D are cross sectional views showing a method of forming a local interconnection in accordance with a prior art technique.
Figure 1B:
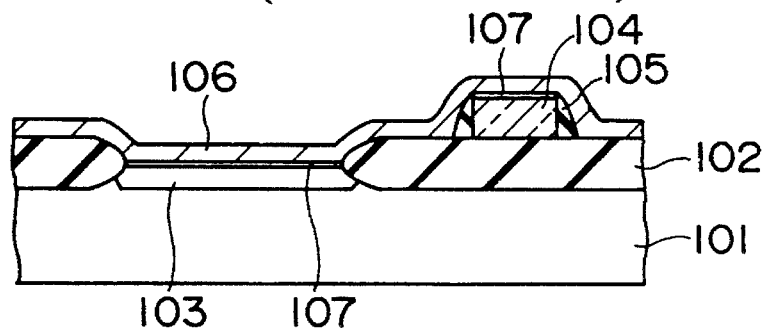
Figure 1C:
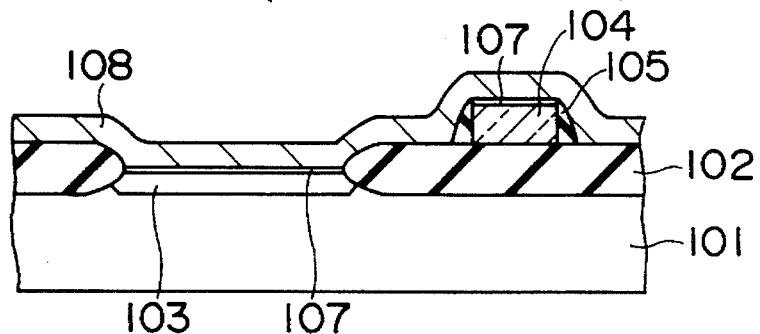
Figure 1D:
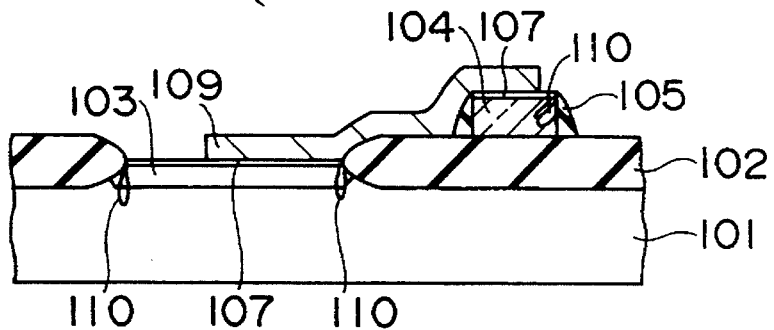
Figure 2:
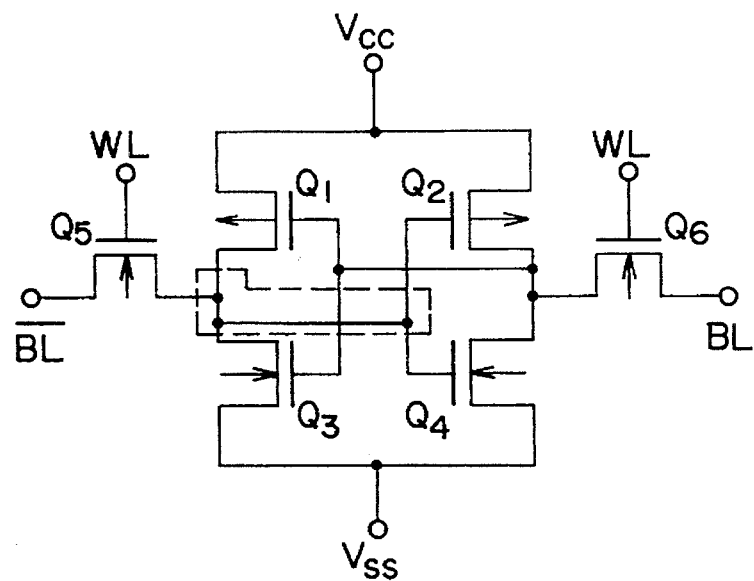
FIG. 2 is a diagram showing the equivalent circuit of an SRAM for which the present invention is applied.

FIG. 2 is an equivalent circuit of an SRAM for which an embodiment of the present invention is applied.

The SRAM includes two CMOS invertors comprising p-channel load transistors $Q_1$ and $Q_2$ and n-channel load transistors $Q_3$ and $Q_4$ respectively.

The gates of the p-channel load transistor $Q_1$ and the n-channel load transistor $Q_3$ forming one of the CMOS invertors are connected to the drain of the n-channel load transistor $Q_4$ of the other of the CMOS invertors respectively. Also, the gates of the p-channel load transistor $Q_2$ and the n-channel load transistor $Q_4$ forming the other of the CMOS invertors are connected to the drain of the n-channel load transistor $Q_3$ of the one of the CMOS invertors respectively in the same manner. Furthermore, the drains of the two load transistors $Q_3$ and $Q_4$ are connected respectively to a bit line BL and an inverted bit line $\overline{BL}$ through the two source/drains of n-channel transfer transistors $Q_5$ and $Q_6$. The term "source/drain" designates an appropriate element functioning as either of a source and a drain and is utilized hereinbelow in this sense.

Furthermore, a voltage Vcc is applied to the sources of the two p-channel load transistors $Q_1$ and $Q_2$ while a voltage Vss is applied to the sources of the two load transistors $Q_3$ and $Q_4$. The gates of the two transfer transistors $Q_5$ and $Q_6$ are connected to a word line WL.

Next, the plan arrangement of the SRAM will be described with reference to FIG. 3.

Figure 3:
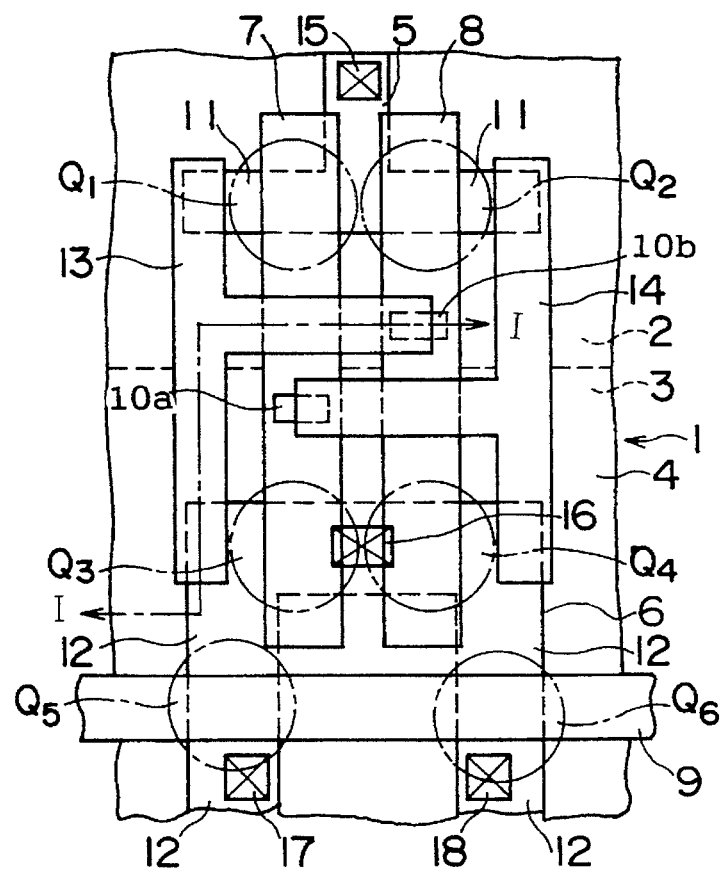
FIG. 3 is a plan view showing the structure of an SRAM for which the present invention is applied.

In FIG. 3, an N-well 2 and a P-well 3 are formed within a semiconductor substrate 1 made of silicon. A field insulating film 4 is formed on the surfaces of the N-well 2 and the P-well 3 by local oxidation.

A first active region 5 having a T-shaped top view is defined by the field insulating film 4 inn the N-well 2. Also, a second active region 6 having a U-shaped top view is defined by the field insulating film 4 in the P-well 3. The first active region 5 and the second active region 6 are located in order that the bottom of the second active region 6 is opposed to the top of the first active region 5 with a certain distance therebetween.

In the first active region 5 and the second active region 6, dual gates 7 and 8 are formed spaced apart from each other in the form of two stripes. These dual gates 7 and 8 are arranged in order to intersect the lateral line of the "T" of the first active region 5 at a right angle and the lower line of the "U" of the second active region 6. Also, a word line 9 is formed passing over the two parallel lines of the "U" of the second active region 6 at a right angle. The dual gates 7 and 8 and the word line 9 are formed on the N-well 2 and the P-well 3 through gate insulating films in the first active region 5 and second active region 6.

The dual gates 7 and 8 function on the first active region 5 as the gate electrodes of the load transistors $Q_1$ and $Q_2$ in FIG. 2 and function on the second active region 6 as the gate electrodes of the load transistors $Q_3$ and $Q_4$. Furthermore, the word line 9 function on the second active region 6 as the gate electrodes of the transfer transistors $Q_5$ and $_6$.

Meanwhile, the dual gates 7 and 8 and the word line 9 are formed from the same polysilicon film or the same amorphous silicon film.

Silicide films 10a and 10b are formed diagonally with respect to each other on the upper surfaces of the dual gates 7 and 8 located on the field insulating film 4 between the first active region 5 and the second active region 6.

The dual gates 7 and 8 are doped with a p-type impurity in the side of the first active region 5 as seen from the silicide films 10a and 10b and doped with an n-type impurity in the side of the second active region 6.

The peripheries of the dual gates 7 and 8 are flanked with sidewall insulating films. The upper surfaces of the dual gates 7 and 8 are covered with an insulating film, except for the surface areas covered with the silicide films 10a and 10b.

P-type impurity diffusion regions 11 are formed within t he first active region 5 except for the portion located just below the dual gates 7 and 8. Also, n-type impurity diffusion regions 12 are formed within the first active region 5 except for the portion located just below the dual gates 7 and 8. Silicide films (not shown) are formed at the surfaces of the p-type impurity diffusion regions 11 and the n-type impurity diffusion regions 12.

The p-type impurity diffusion regions 11 function as the source and drain regions of the load transistors $Q_1$ and $Q_2$ while the n-type impurity diffusion regions 12 function as the source/drain regions of the transfer transistors $Q_5$ and $Q_6$.

The load transistors $Q_1$ and $Q_2$ and the load transistors $Q_3$ and $Q_4$ are coupled to form two pairs of CMOS invertors, which are cross-coupled by means of local interconnections 13 and 14.

These local interconnections 13 and 14 are shaped approximately in the form of letter "T". The drain regions of the load transistors $Q_1$ and $Q_2$ are connected to the drain regions of the load transistors $Q_3$ and $_4$ through these local interconnections 13 and 14. Furthermore, the local interconnection 13 (or 14) is passed over one of the dual gates 7 (or 8) and connected to the silicide film 10a (or 10b) of the other dual gate 8 (or 7).

The six transistors $Q_1$ to $Q_6$ are covered with an insulating film (not shown). A contact hole 15 is opened through the insulating film just above the common source region of the two load transistors $Q_1$ and $Q_2$ for making connection with the interconnection of the voltage Vcc. Also a contact hole 16 is opened through the insulating film just above the common source region of the two load transistors $Q_3$ and $Q_4$ for making connection with the interconnection of the voltage Vss. Furthermore, contact holes are opened through the insulating film just above the two source/drain regions of the transfer transistors $Q_5$ and $Q_6$ that are not connected to the local interconnection 16 for making connection with the bit line BL and the line $\overline{BL}$.

Next, a method for forming the local interconnections 13 and 14 will be described.

FIGS. 4A to 4F are cross sectional views showing a method for forming a semiconductor integrated circuit in accordance with an embodiment of the present invention. These cross sectional views correspond to the area enclosed by broken line in FIG. 2 and a cross section along chain line I—I in FIG. 3.

Figure 4A:
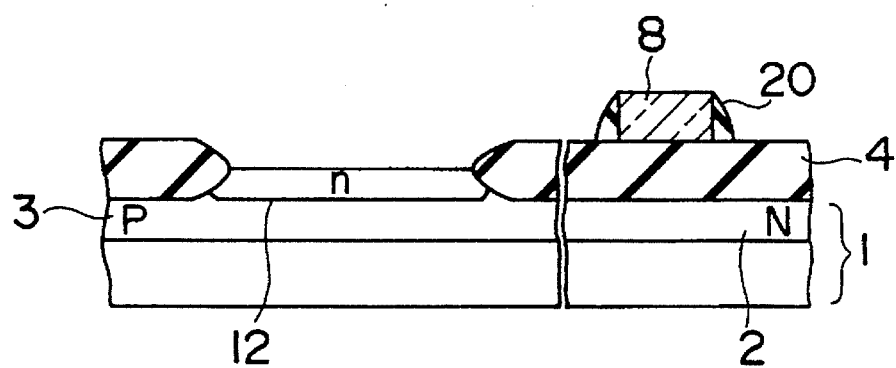
FIGS. 4A to 4F are cross sectional views showing a method of forming a local interconnection in accordance with the present invention.

The n-type impurity diffusion regions 12 has been formed in the surface of the semiconductor substrate 1 surrounded by the field insulating film 4 in advance of the formation of the local interconnection as illustrated in FIG. 4A. Also, the dual gate 8 has been formed from an impurity polysilicon or an impurity amorphous silicon on the field insulating film 4. The dual gate 8 is formed as the first interconnection and is flanked with sidewalls 20 made of silicon oxide. The upper surfaces of the dual gates 7 and 8 are covered with an insulating film, except for the surface areas covered with the silicide films 10a and 10b.

Figure 4B:
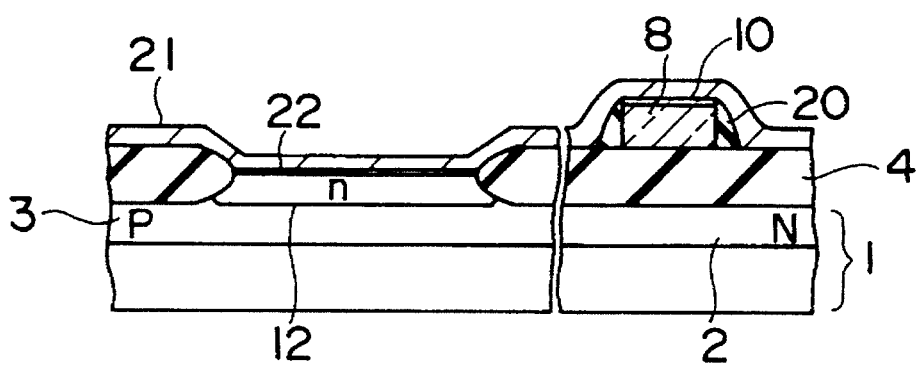

With this structure, a titanium film 21 is deposited to a thickness of 10 to 30 nm by sputtering on the dual gate 8, the n-type impurity diffusion regions 12 and the field insulating film 4 as illustrated in FIG. 4B. Thermal treatment is then carried out in accordance with RTA (rapid thermal annealing), e.g., for 15 min at 1000° C., in order to form titanium silicide (TiSi) films 10b and 22 at the upper surfaces of the dual gate 8 and the n-type impurity diffusion regions 12 by a reaction between the titanium film 21 and silicon contained in the dual gate 8 and the n-type impurity diffusion regions 12.

Figure 4C:
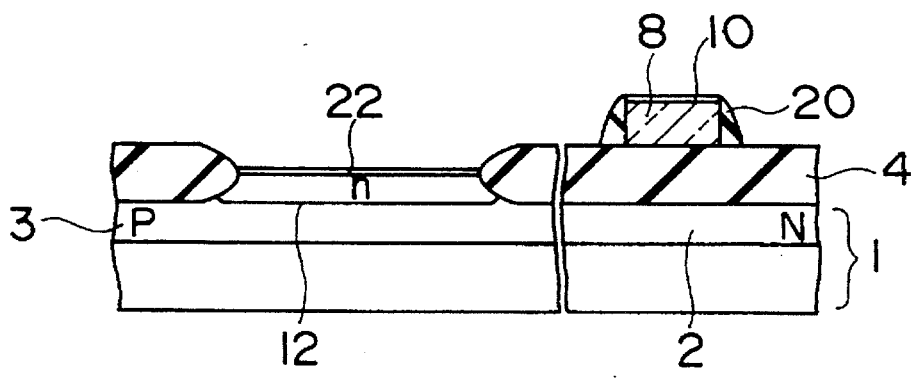
Figure 4D:
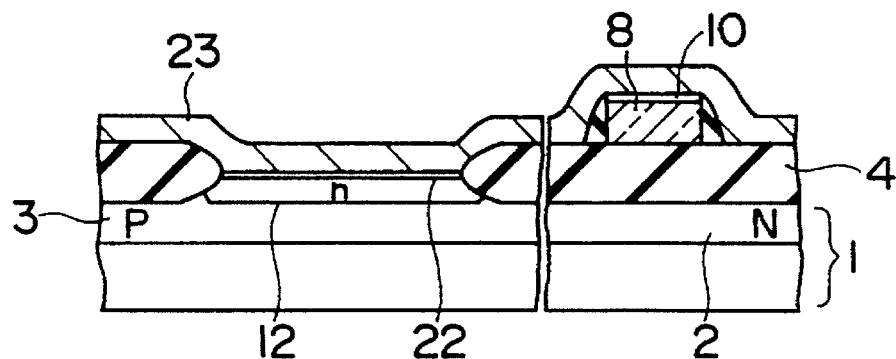

The titanium film 21 is then removed by a mixed etchant made of hydrogen peroxide and ammonia, leaving the silicide films 10b and 22, as illustrated in FIG. 4C.

Next, a tungsten nitride (WN) film 23 is deposited to a thickness of 30 to 50 nm by sputtering on the silicide films 10b and 22, the field insulating film 4 and so forth. The sputtering is carried out with a tungsten target in a nitrogen atmosphere.

Figure 4E:
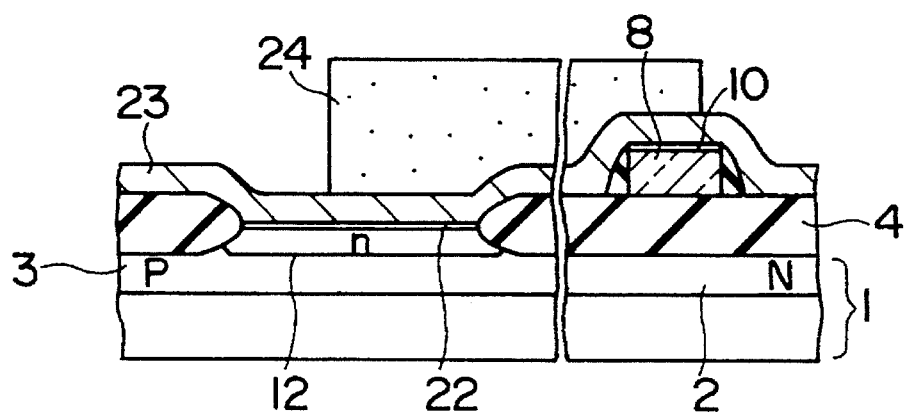

A photoresist film is then coated on the structure, exposed and developed to generate a resist pattern 24 covering the area in which the local interconnection is to be formed as illustrated in FIG. 4E. Namely, the area extends from the n-type impurity diffusion regions 12 to the silicide films 10b and 22 on the dual gate 8 through the field insulating film 4 in the illustration.

Figure 4F:
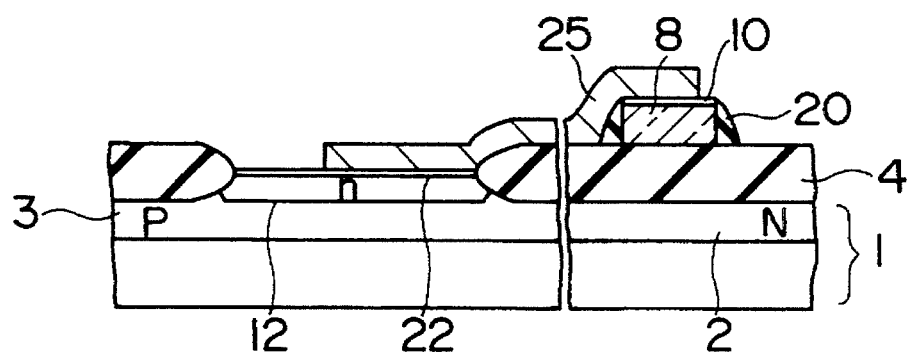

Next, as illustrated in FIG. 4F, the tungsten nitride film 23 is etched with the resist pattern 24 as a mask. The tungsten nitride film 23 lingering under the resist pattern 24 after the etching serves as a local interconnection 25.

The etching of the tungsten nitride film 23 is carried out by means of an RIE device provided with electrodes made of parallel plates opposed to each other, which are connected to an electronic power supply of 400 W. $CF_4$ and $CHF_3$ are introduced as an etchant gas into the chamber of the device respectively at 100 sccm to be held at the pressure of about 0.1 Torr in the chamber.

In this situation, the following reaction takes place between the tungsten nitride film 23 and the etchant gas.

$$WN + CFx \rightarrow WFx + CFN$$

Since volatility of WFx and CFN is high, the tungsten nitride film 23 is easily etched. Because of this, no residue of carbon lingers on the tungsten nitride film 23 so that it is no longer the case that the progress of etching is arrested by the lingering carbon.

However, it is not appropriate to utilize only $CF_4$ as the etchant gas. This is because silicon exposed at the peripheries of the field insulating film 4 and the dual gate 8 tends to react with fluorine contained in the etchant gas of $CF_4$ alone, which is rich in fluorine, and tends to be sublimated as silicon fluoride.

If $CHF_3$ is introduced in addition to $CF_4$, the atmosphere rich in fluorine is avoided since fluorine can readily combine with hydrogen and go away from the structure. Furthermore, carbon contained in the etchant gases react with silicon of the surfaces of the semiconductor substrate 1 and the dual gate 8 and generate a polymer compound which is not sublimable and serves as an etchant-proof film.

Accordingly, $CHF_3$ has to be introduced, at the latest, when the tungsten nitride film 23 becomes thinned or when the tungsten nitride film 23 lingering near the steps at the peripheries of the field insulating film 4 and the like is removed by over-etching.

As described above, solved is the conventional problem that grooves are formed by etching the semiconductor substrate 1 and the dual gate 8 in the process of forming the local interconnection. Namely, little current leakage is passed through the junction between the semiconductor substrate and the impurity diffusion region; the profile of the dual gate is maintained with little deformation so that the interconnection resistance is not increased; and the fluctuation of the threshold voltage is limited within the tolerable range.

Whereas the field insulating film 4 and the sidewalls 20 are etched during over-etching the tungsten nitride film 23, the problem due to the etching can be dealt with, for example, by increasing the thicknesses of the field insulating film 4 and the sidewalls 20 or by adjusting the over-etching condition.

Meanwhile, if a tungsten film is used in place of the tungsten nitride film 23, carbon atoms are attached to the surface of the tungsten film decelerating the etching speed, so that the use of the tungsten film is not appropriate.

Also, if a titanium film is used in place of the tungsten nitride film 23, the etching speed is decelerated, since evapolability of titanium fluoride is low and carbon atoms are attached to the surface of the tungsten film, so that the use of the titanium film is not appropriate.

Furthermore, if a titanium nitride film is used in place of the tungsten nitride film 23, the etching speed becomes low insufficient for practical use when a mixed gas of $CF_4$ and $CHF_3$ is utilized. Whereas titanium nitride can be etched by a $Cl_2$-based gas, silicon tends to damage with the etchant.

(Other Embodiments)

Although the combination of $CF_4$ and $CHF_3$ is utilized to prepare the mixed etchant gas in the embodiment described above, the present invention can be carried out by the use of other combinations of a gas comprising fluorine and a gas comprising hydrogen, such as $CF_4$ and $H_2$.

Also, although a titanium silicide film is used as the silicide film to be formed on the dual gate, other silicide such as cobalt silicide, the silicide of a noble metal, the silicide of a refractory metal can be used.

Furthermore, the local interconnection can be connected directly to the dual gate without a silicide film therebetween.

The above explanation is directed to the embodiment for forming local interconnection for connecting the impurity diffusion region with the first interconnection (dual gate). However, also in the case that impurity diffusion regions are interconnected to each other, no groove is formed in a silicon region during the process as described above.

In accordance with the embodiment as described above, local interconnections are formed from a tungsten nitride film which is patterned by etching with a gas comprising fluorine to which a gas comprising hydrogen is added, at the latest, when the tungsten nitride film becomes thinned.

Since the atmosphere of the etching gases does not become rich in fluorine, the selectivity of etching tungsten nitride films respective to semiconductors such as silicon semiconductors is improved so that semiconductors are hardly etched. As a result, even if the thin peripheries of the field oxide film are etched to expose part of the underlying semiconductor region, it is avoided that a groove is formed in the semiconductor region by etching.

Substantial leakage current can therefore be prevented from passing through PN junctions formed within a semiconductor layer. Furthermore, even in the case that interconnections or gate electrodes are formed from semiconductor layers, the resistances thereof can be prevented from varying due to the change of the shapes. Also, the threshold of a transistor can be prevented from varying due to the change of the shape of the gate electrode.

What is claimed is:

1. A method for manufacturing a semiconductor device, said method comprising the steps of:

forming an impurity diffusion region as a first conductive region within a semiconductor layer;

forming a tungsten nitride film on a region including said impurity diffusion region;

selectively forming an etch mask on said tungsten nitride film located extending from said impurity diffusion region to a second conductive region; and removing said tungsten nitride film by dry etching in accordance with said etch mask, said dry etching including the steps of a) introducing a gas comprising fluorine, and b) introducing a gas comprising hydrogen after said tungsten nitride film is initially thinned by etching with said gas comprising fluorine.

2. The method for manufacturing a semiconductor device as claimed in claim 1 wherein said semiconductor layer is a silicon semiconductor layer.

3. The method for manufacturing a semiconductor device as claimed in claim 1 wherein a silicide film is formed on a surface of said impurity diffusion region.

4. The method for manufacturing a semiconductor device as claimed in claim 1 wherein said second conductive region is either of an interconnection and a second impurity diffusion region.

5. The method for manufacturing a semiconductor device as claimed in claim 4 wherein a silicide film is formed on a surface of said interconnection.

6. The method for manufacturing a semiconductor device as claimed in claim 1 wherein said gas comprising fluorine is $CF_4$, and said gas comprising hydrogen is one selected from the group consisting of $H_2$ and $CHF_3$.

* * * * *